United States Patent

Effenberger

[15] 3,667,052

[45] May 30, 1972

[54] CIRCUIT FOR ACCURATE TUNING OF A YITTRIUM IRON GARNET (YIG) FILTER

[72] Inventor: Frank V. Effenberger, 403 Newark Avenue, Point Pleasant Beach, N.J. 08742

[22] Filed: Feb. 20, 1970

[21] Appl. No.: 13,265

[52] U.S. Cl. ..............................325/452, 325/455, 325/469, 334/18, 334/26

[51] Int. Cl. ..............................H04q 3/18

[58] Field of Search ..................325/452, 454, 455, 457, 468, 325/469, 470, 363; 333/17; 334/18, 26, 29; 178/DIG. 4

[56] References Cited

UNITED STATES PATENTS

| | | | |
|---|---|---|---|
| 3,293,572 | 12/1966 | Smith | 325/469 |
| 3,484,707 | 12/1969 | Iwahara | 334/26 |
| 3,214,064 | 3/1966 | Bartels et al. | 334/18 |
| 3,531,724 | 9/1970 | Fathauer | 325/469 |
| 2,726,326 | 12/1955 | Winfield | 325/469 |
| 2,952,770 | 9/1960 | Downie | 178/DIG. 4 |

*Primary Examiner*—Robert L. Griffin
*Assistant Examiner*—Peter M. Pecori
*Attorney*—Harry M. Saragovitz, Edward J. Kelly, Herbert Berl and Gordon W. Kerr

[57] ABSTRACT

The magnetically tuned broadband YIG filter characterized by a predetermined passband at its half power points has a plurality of marker frequencies spaced apart by the width of the passband applied to its input while the magnetic tuning flux is varied in programmed fashion. Detector circuitry connected to the filter output produces a beat frequency equal to the frequency span of the passband each time the filter's half power points are brought into coincidence with a pair of the marker frequencies. A programmed tuning logic circuit keeps track of the number of coincidences of the half power points and successive marker frequency pairs tuned through and automatically halts the flux variation when the filter is tuned to the programmed marker frequency pair. The tuning circuitry can be disconnected after the tuning operation.

5 Claims, 5 Drawing Figures

INVENTOR.
FRANK V. EFFENBERGER
BY: Gordon W. Kerr,
Harry M. Saragovitz,
Edward J. Kelly & Herbert Berl
ATTORNEYS INVENTOR.
FRANK V. EFFENBERGER
BY: Gordon W. Kerr,
Harry M. Saragovitz,
Edward J. Kelly & Herbert Berl
ATTORNEYS.

CIRCUIT FOR ACCURATE TUNING OF A YITTRIUM IRON GARNET (YIG) FILTER

The invention described herein may be manufactured, used and licensed by or for the Government for governmental purposes without the payment to me of any royalty thereon.

This invention relates to circuitry and a technique for accurately tuning a microwave YIG filter to any one of a plurality of discrete frequency bands that are spaced apart by at least the frequency span of the half power points of the filter. This type of filter is broadband. It comprises a small YIG crystal mounted in a waveguide and acted upon by an external magnetic field. Molecular resonance occurs at different microwave frequencies depending on the strength of the magnetic field applied to the crystal. Such filters can be tuned over a range of frequency by varying the magnetic field strength of an electromagnet. It would be a simple matter to vary the field strength of an electromagnet by means of a rheostat or some such device and to calibrate an ammeter to indicate the applied magnetizing force (H), However, in an ironclad magnetic circuit hysteresis effect makes it impossible to accurately indicate the YIG filter tuning in terms of current through the electromagnet. Attempts to overcome this problem have been made in the past, with little success. One approach has been to reduce hysteresis, but this yields improvement only up to a certain point, since hysteresis is a fundamental property of all ferromagnetic materials. Another solution would be to sense and indicate the flux density acting on the YIG crystal and tune in accordance therewith rather than the current which caused the flux. This approach would require a flux meter, for example a Hall-type sensor, but these have exhibited low sensitivity in practice. Further, the flux within the YIG crystal must be inferred from measurements made outside thereof and this causes inaccuracies. A still further approach has been to side step the hysteresis problem by making the YIG filter bandwidth much wider than is necessary to accommodate the signals of interest. Unfortunately, this expedient results in high insertion loss which degrades the system noise figure and also allows unwanted signals to pass through the filter, resulting in decreased signal-to-noise ratios. The circuit which is the subject of this invention provides accurate tuning and accurate tuning indication of the YIG filter without errors caused by hysteresis or any of the above-noted disadvantages.

Briefly, stated, the present invention comprises means to automatically disconnect the filter from its signal source and utilization circuit when a frequency change is desired. The circuit comprises means for automatically applying a plurality of marker (or comb) frequencies to the filter input, the marker frequency separation being approximately equal to the filter bandwidth. The YIG filter electromagnet tuning current automatically begins to increase when a frequency change is desired and circuit means are temporarily connected to the filter output to detect the beats produced as different adjacent pairs of marker frequencies pass through the filter. A tuning logic circuit counts the number of such marker pairs that pass through the filter and when the selected or desired tuning is reached the electromagnet tuning current increase is automatically halted and the current maintained at a value to maintain the desired tuning. The signal source and utilization circuits then are reconnected to the input and output respectively of the filter. With such a system, it is unnecessary to measure or indicate the flux density. All that is necessary is that a known one, for example, the highest or lowest discrete marker frequency be established. Thereafter the tuning logic circuitry can "remember" or keep track of all of the discrete steps to which the filter can be tuned.

It is thus an object of this invention to provide a novel and useful tuning mechanism for a broadband microwave filter, the tuning of which depends on the magnitude of the flux density therein.

Another object of the invention is to provide a circuit for automatically tuning a broadband filter to any one of a number of discrete bands having widths essentially equal to the frequency span across the half power points of the filter.

Another object of the invention is to provide an automatic tuning system for a magnetically tuned filter.

These and other objects and advantages of the invention will become apparent from the following detailed description and drawings, in which.

Figure 1:
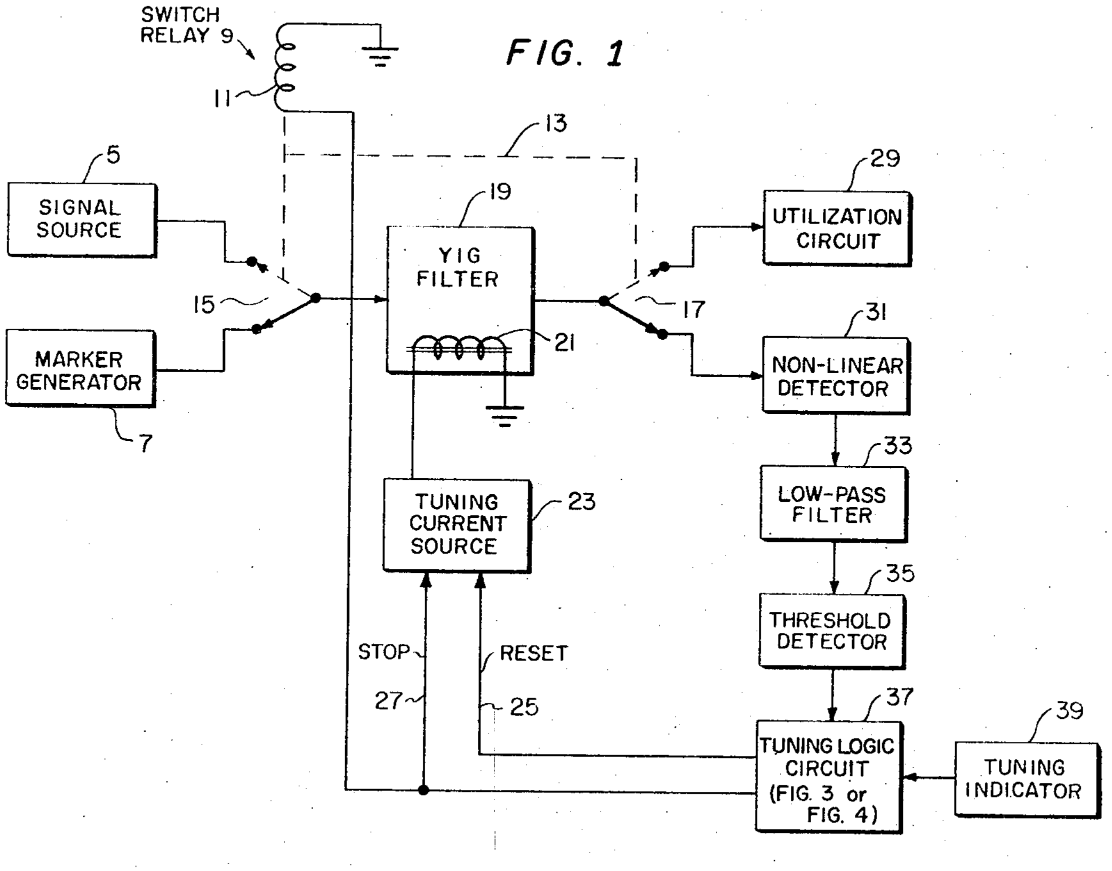
FIG. 1 is a block diagram of a preferred embodiment of the invention.

The diagram of FIG. 1 includes a signal source 5 and a marker generator 7 which are alternately connectible to the input of YIG filter 19 through the single pole, double-throw contacts 15 of switch relay 9. A second set of similar contacts 17 of the relay 9 alternately connect the filter output to a utilization circuit 29 or to the non-linear detector 31. In practice the signal source 5 may comprise an antenna, for example, and the utilization device 29 a radio receiver, the YIG filter then functions as a preselector or RF stage for the receiver. When a tuning change is desired the switch relay coil 11 is automatically de-energized by circuitry to be described and the two contacts 15 and 17 thereof are retracted to the lower position, as shown in the drawing, and the filter automatically tuned to a selected discrete frequency, after which the relay coil 11 is re-energized to reinsert the filter in the receiver circuit. The YIG filter includes an ironclad electromagnet 21 for producing tuning flux therefor. The tuning current source 23 provides current for the electromagnet 21. The tuning current source is controlled by two outputs 25 and 27 of the tuning logic circuit 37. These are labelled Reset and Stop respectively. The Stop line 27 also actuates the coil 11 of switch relay 9. In the absence of a signal on Stop line 27, the tuning current source provides a tuning current which continually increases in one direction until the upper limit of the tuning is reached, at which time a pulse on Reset line 25 returns the tuning current to its minimum value and the cycle repeats. The tuning current is thus generally of sawtooth or other cyclic waveform. When a desired frequency is reached, determined by the setting of a selector means or switch within tuning logic circuit 37, a signal on Stop line 27 halts the tuning current increase and holds the current at a value corresponding to the desired frequency. Simultaneously, the energization of relay coil 11 returns the contacts 15 and 17 to their upper, dashed line position.

The circuit further includes a non-linear detector 31 connected to the filter output via relay contacts 17. A low pass filter 33 and a threshold detector 35 are connected in cascade to the detector 31. The output of threshold detector 35 forms an input to tuning logic circuit 37. A tuning indicator 39 is connected to circuit 37. The detector 31 may be any non-linear device such as is ordinarily used as a second detector in AM receivers or other type of mixer which will produce beat or difference frequencies in response to the output of marker generator 7. The filter 33 has a cutoff frequency slightly above the difference between adjacent marker frequencies. Thus this filter passes the beat or difference frequencies to threshold detector 35, which may simply be a biased diode for passing filter 33 output which exceeds a threshold voltage determined by the diode bias.

Figures 2A, 2B:
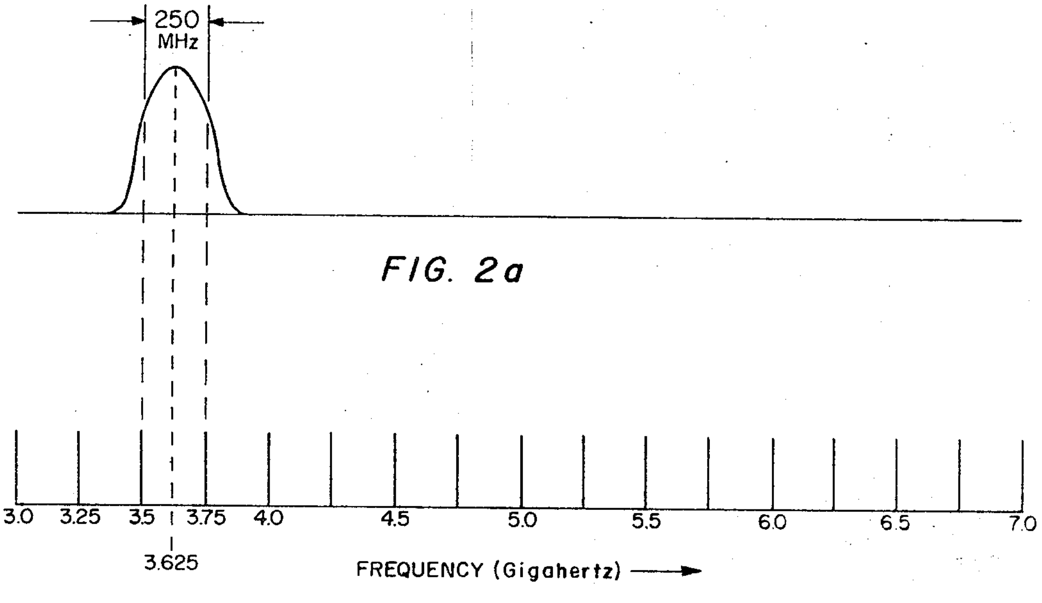
FIG. 2 illustrates the marker frequencies and how they are related to filter passband.

In FIG. 2 are shown illustrative outputs of the marker generator 7. This generator may comprise an oscillator plus a harmonic generator for producing a series of equally spaced frequencies extending over the tuning range of the YIG filter. In the example, the generator 7 produces 17 frequencies extending from 3.0 to 7.0 gigahertz as seen in FIG. 2*b*. FIG. 2*a* shows the passband of the YIG filter with the filter tuning centered halfway between the 3.5 and 3.75 gigahertz marker frequencies. Thus the filter center frequency is at 3.625 gigahertz. Thus the filter center frequency is at 3.625 gigahertz. Thus in this example, the filter can be tuned to 16 discrete frequencies spaced 0.250 gigahertz (or 250 megahertz) apart, each center tuning frequency falling halfway between adjacent marker frequencies. As can be seen in FIG. 2*a*, the filter bandwidth is 250 megahertz wide at its half power points, so that only two marker frequencies can be passed at any one time.

Figure 3:
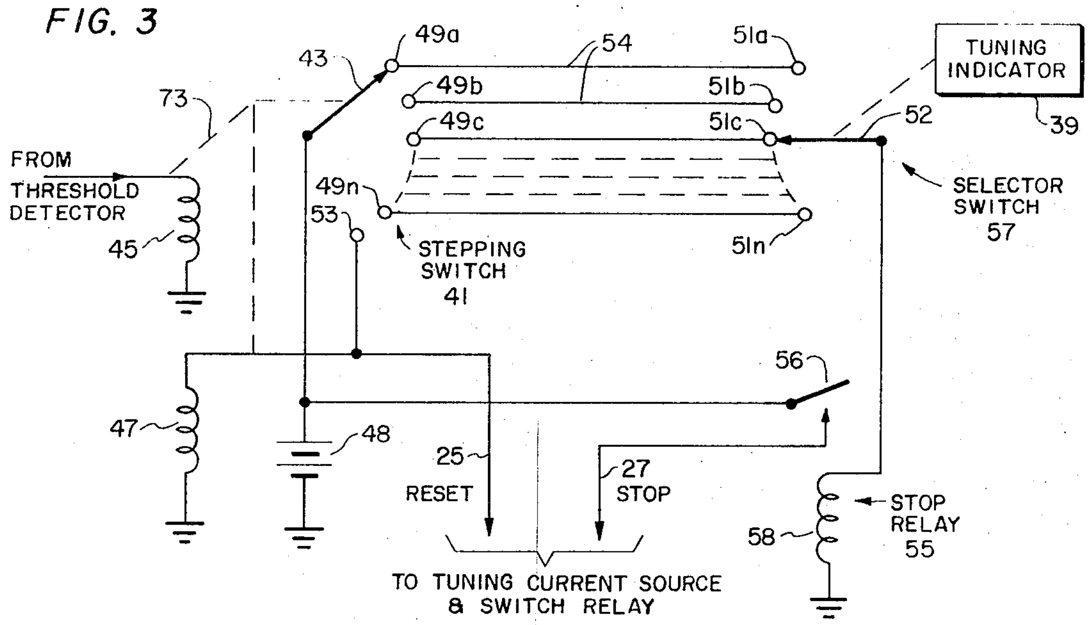
FIGS. 3 and 4 show different specific embodiments of the tuning logic circuit of FIG. 1.

FIG. 3 illustrates detailed circuitry of an electromechanical embodiment of the tuning logic circuit 37 of FIG. 1. This circuit includes a stepping switch 41 which includes a drive coil 45 which steps the switch arm 43 along an array of contacts 49*a*, 49*b*, 49*c*, 49*n* via a mechanical connection indicated by dashed lines 73. Each pulse applied to drive coil 45 advances the arm 43 to the next adjacent contact. Switch 41 also includes a reset contact 53 and reset coil 47. When the arm 43 reaches contact 53 it connects battery 48 to reset coil 47. The energization of 47 rapidly resets the switch arm 43 to its initial position under the influence of a spring, not shown, and the reset coil 47 is de-energized. The selector switch 57 includes a manually-operable rotor or arm 52, to which is mechanically connected a tuning indicator, which may comprise merely a set of numbers or other indicia corresponding to the discrete frequencies to which filter 19 is tunable, arranged adjacent to the stationary contacts 51*a* – 51*n* of switch 57. The switch 57 has as many stationary contacts as does the stepping switch 41, not counting the reset contact 53 thereof. Corresponding contacts of the two switches 41 and 57 are connected by jumpers, as illustrated at 54. The arm 43 is connected to the battery 48 and arm 52 of the selector switch is connected to the coil 58 of stop relay 55. The normally open contacts 56 of relay 55 connect the positive terminal of battery 48 to Stop line 27. The Reset line 25 is connected to contact 53, as shown. The drive coil 45 is actuated by the output of threshold detector 35 of FIG. 1.

To illustrate the operation of the tuning logic, assume that the filter is tuned to the lowest discrete frequency in its tuning range. In this condition switch arm 43 would be on contact 49*a*, as shown, and selector switch arm 52 on contact 51*a*. Thus the stop relay coil 58 would be energized via battery 48, arm 43, contact 49*a*, the jumper 54, contact 51*a*, arm 52 and coil 58. The resulting positive Stop pulse on line 27 would have held the output of tuning current source 23 at the steady dc value required to tune to the lowest discrete frequency. Assume now that it is desired to select a frequency two discrete steps higher than the lowest, which would be the center frequency of 3.625 megahertz, as illustrated in FIG. 2. This frequency would correspond to the contact 51*c* of the selector switch 57, to which the arm 52 is shown connected in FIG. 3. As soon as the selector switch is moved to a new position, the voltage to stop relay coil 58 is interrupted, the contacts 56 open and the Stop pulse on line 27 disappears. The tuning current source thus starts increasing its output and the resonant frequency of the filter increases. When the filter passband is straddling the 3.25 and 3.5 megahertz marker frequencies, these two markers will produce a beat or difference frequency of 250 megahertz which will be applied to threshold detector 35. When this beat signal exceeds the threshold of 35, the diode therein conducts and produces a dc pulse which actuates drive coil 45 of the stepping switch 4. The threshold detector 35 is thus seen to be similar in circuitry to a delayed AVC circuit commonly used in AM receivers. This first pulse to coil 45 steps switch arm 43 to contact 49*b*. Since stop relay 55 is still de-energized, the tuning continues to increase. When the filter passband reaches the next set of marker frequencies (3.5 and 3.75 gigahertz), another pulse is applied to drive coil 45 from detector 35. This pulse steps switch arm 43 to contact 49*c* which is connected by a jumper to selector switch contact 51*c*. The Stop relay coil 58 is then energized to produce a Stop pulse on line 27, which halts the increase of tuning current source 23. The switch relay 9 is also actuated to return the filter to its signal source and utilization circuit. If the selector switch 57 is switched to a lower frequency, the tuning current source and the stepping switch will step the tuning upward in frequency until the highest discrete frequency is reached, this corresponding to contact 49*n* on stepping switch 41. The next pulse from threshold detector 35 steps switch 41 onto the reset contact 53 which resets the switch 41 as well as the tuning current source 23 to that value of current required to tune the filter to the lowest frequency. The tuning then automatically continues upward to the selected frequency in the manner already described.

Figure 4:
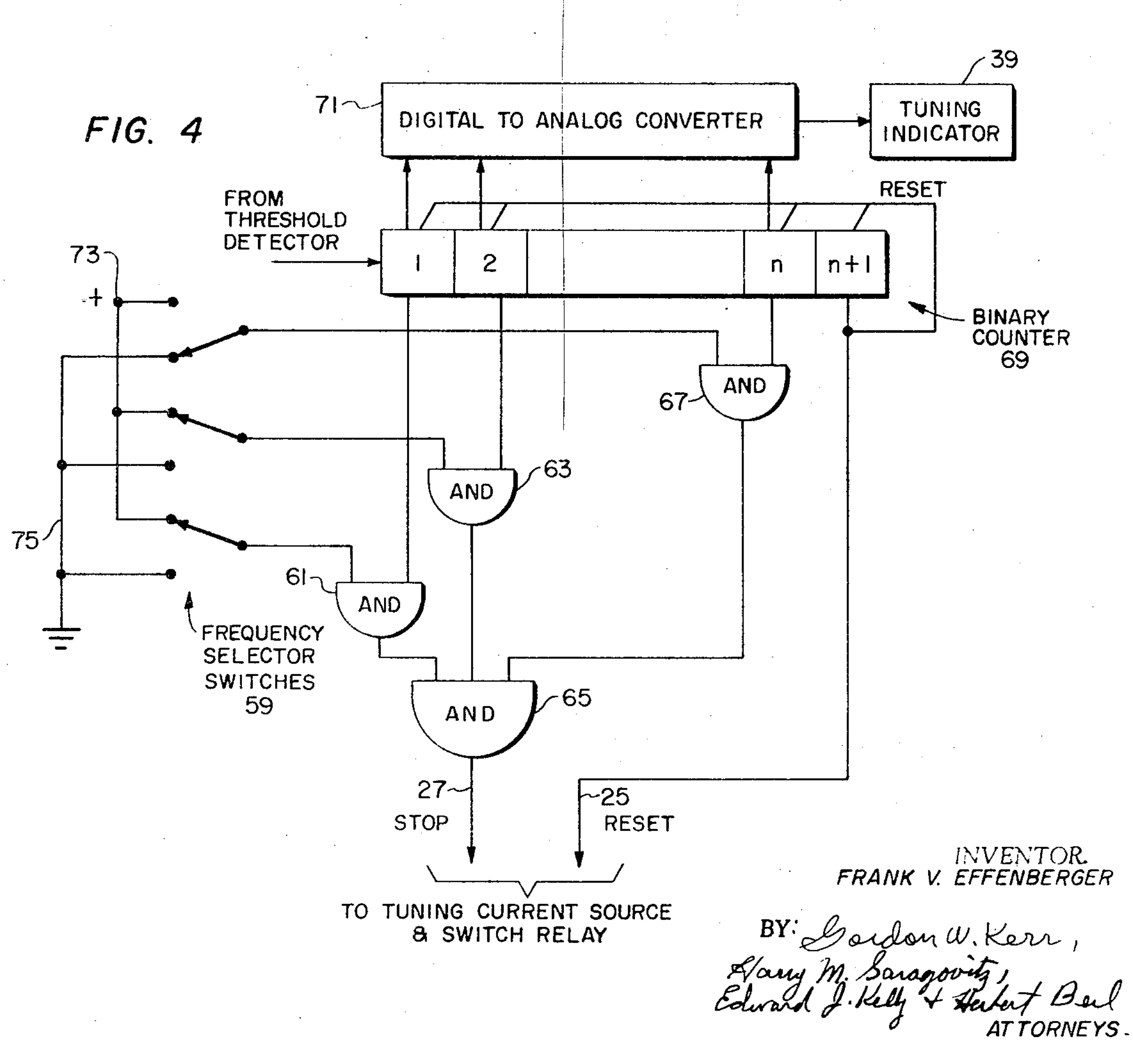

The diagram of FIG. 4 illustrates how the tuning logic circuit 37 may comprise electronic circuitry instead of an electromechanical circuit. The only moving parts in FIG. 4 are the frequency selector switches 59. The mode or principle of operation of the circuit of FIG. 4 is virtually the same as FIG. 3. The function of the stepping switch is performed by a binary counter 69 which has $n+1$ stages where $n$ is the number of digits required to count to the number of discrete tuning frequencies. The counter input is the output of the threshold detector. Each set output of each counter stage is connected to an input of a digital-to-analog converter 71. This converter produces a dc or analog voltage proportional to the counter reading and this voltage is applied to a tuning indicator 39. The indicator 39 may be merely a dc voltmeter with its scale calibrated in frequency. A double-throw frequency selector switch is provided for each one of the $n$ binary digits or bits. The switches are connectible to either a positive voltage terminal 73 in the upper position or ground 75 in the lower position, these two positions corresponding to the two binary states 0 and 1. The desired discrete frequency is selected by manually turning switches 59 to the binary number corresponding thereto. Each switch arm forms one input of AND gates 61, 63 and 67, the other input of which is the set output of the corresponding counter stage. It can be seen that all of the two-input AND gates 61, 63, 67 will simultaneously have outputs when the binary counter reading corresponds to the binary number set up on selector switches 59. An $n$ input AND gate 65, having as inputs all of the outputs of the two-input AND gates, will then produce a Stop pulse on line 27 which pulse will stop the tuning current source and actuate the coil 11 of switch relay 9. When the binary counter reaches stage $n+1$, a pulse is produced on Reset line 25 which pulse is applied to each reset input of the counter stages to reset all stages to zero. Simultaneously, the reset pulse is applied to the tuning current source 23 to reset it to its minimum value. The tuning of the filter may be accomplished remotely by simply replacing the frequency selector switches 59 with a parallel binary signal applied to the two-input gates from a remote source, which may be a computer.

It will be appreciated that this invention provides novel and useful circuitry for accurately tuning a filter and indicating the frequency thereof. While specific embodiments of the invention have been described, obvious variations thereof will be apparent to those skilled in the art.

What is claimed is:

1. An automatic tuning circuit for a magnetically tuned broadband filter characterized by predetermined frequency span across its half power points, comprising means to apply simultaneously a plurality of spaced pairs of marker frequencies to the input of said filter, the frequency span across all of said pairs being essentially equal to said predetermined frequency span, all of said marker frequencies having essentially equal amplitudes, filter tuning means operable to vary the magnetic flux of said filter to vary the tuning of said filter so that the frequencies of its half power points are changed to the frequencies of successive marker frequency pairs and also operable to non-varying state to maintain the magnetic flux of said filter at a level such that the frequencies of the half power points are maintained at frequencies that are about the same as a selected pair of marker frequencies, means connected to the output of said filter to pass a difference beat frequency equal to said frequency span and that exceeds a predetermined threshold and to block said marker frequencies, and counting means connected to the output of said beat frequency passing means to count the number of beat frequency occurrences and operable to change operation of said filter tuning means from varying to non-varying state at a preselected count whereby the frequencies of the half power points are maintained about the same as that pair of the marker frequencies at the preselected count.

2. A circuit for tuning a broadband magnetically tunable filter that includes an ironclad electromagnet for tuning said filter over a range of the radio frequency spectrum and having a predetermined passband between the half power points of its characteristic comprising;

a tuning current source for connection to the electromagnet and for providing current that varies cyclically between limits for sweeping the filter tuning over its range and controllable to stop at any current between those limits and resettable to resume cycling from the stopped current level, a marker generator for producing a pair of equal amplitude signals having frequencies within the tuning range of the filter and wherein the frequency span across the signals is numerically equal to the passband of the filter, a non-linear detector, relay switch means connecting the input of the filter to a signal source or the marker generator and for connecting the output of the filter alternately to a utilization circuit or the non-linear detector, a low pass filter for passing signal energy having a frequency numerically equal to the frequency span across the pair of signals, a threshold detector connected to the output of said low pass filter, means coupled to the output of said threshold detector and coupled to said tuning current source and said relay switch means and responsive to output from said detector for setting the tuning of said broadband filter so that the frequencies of its half power points coincide with the signals from the marker generator.

3. A circuit for tuning a broadband magnetically tunable filter as defined in claim 2 wherein said marker generator produces a plurality of pairs of equal amplitude signals within the tuning range of the filter and wherein the frequency difference between successive pairs is no less than the passband of the filter and the frequency span across the signals of each pair is equal to the passband of the filter, and wherein said last-mentioned means is programmable for tuning the broadband filter to a selected one of said signal pairs.

4. A circuit for tuning a broadband magnetically tunable filter as defined in claim 3 wherein all the signals generated by said marker generator are spaced apart by equal frequency differences.

5. The method of tuning the passband of a broadband filter characterized by a known frequency span at its half power joints to any one of a selected plurality of locations in the radio frequency spectrum comprising coupling into said filter at the same time, pairs of frequencies wherein all the frequencies are of essentially equal amplitude and the frequencies of each pair differ by said known frequency span and all of the pairs of frequencies are spaced apart no less than said frequency span, beating together frequencies appearing at the filter output, sensing for that frequency corresponding to the difference beat frequency of any of said pairs of frequencies that exceeds a predetermined threshold, varying the tuning of said filter to scan the frequency band that includes said pairs of frequencies until that occurrence of the difference beat frequency that exceeds the predetermined threshold is sensed which corresponds to the desired position of the filter passband in the spectrum, and terminating the variation in the tuning of the filter passband at said desired position in the spectrum.

* * * * *